United States Patent [19]
Matthews

[11] Patent Number: 5,306,915
[45] Date of Patent: Apr. 26, 1994

[54] INFRARED DETECTORS

[75] Inventor: Brian E. Matthews, Southampton, Great Britain

[73] Assignee: U.S. Philips Corporation, New York, N.Y.

[21] Appl. No.: 922,117

[22] Filed: Jul. 28, 1992

[30] Foreign Application Priority Data

Jul. 29, 1991 [GB] United Kingdom ............ 9116307

[51] Int. Cl.$^5$ ............ H01L 27/146; H01L 31/0296; H01L 31/101
[52] U.S. Cl. .................. 250/370.13; 250/332; 250/338.4; 250/349; 250/370.08
[58] Field of Search ........ 250/370.13, 370.10, 250/370.08, 349, 338.4, 332; 257/432, 433, 465

[56] References Cited

U.S. PATENT DOCUMENTS

| | | | |
|---|---|---|---|
| 4,521,798 | 6/1985 | Baker | 257/442 |
| 4,559,695 | 12/1985 | Baker | 437/3 |
| 4,629,892 | 12/1986 | Carmichael et al. | 250/353 |

FOREIGN PATENT DOCUMENTS

| | | |
|---|---|---|
| 61-182531 | 8/1986 | Japan ............ 250/349 |
| 1-320438 | 12/1989 | Japan ............ 250/370.13 |
| 1525562 | 9/1978 | United Kingdom . |
| 2132757 | 7/1984 | United Kingdom . |
| 2240444 | 7/1991 | United Kingdom . |
| 2241605 | 9/1991 | United Kingdom . |
| 2248964 | 4/1992 | United Kingdom . |

*Primary Examiner*—Constantine Hannaher
*Attorney, Agent, or Firm*—Keck, Mahin & Cate

[57] ABSTRACT

At least one detector element (1) of cadmium mercury telluride or other infrared-sensitive semiconductor material is sandwiched between a substrate (20) and a lens plate (10) or other optical element. When an adhesive layer (11) is used to secure the lens plate or substrate over the detector element (1), there is found to be an unexpected decrease in cut-off wavelength and increase in junction resistance. In experiments leading to the invention, these changed characteristics were found to result from stress induced in the semiconductor material (1) by contraction of the adhesive (11) which led to a change in the energy bandgap of the semiconductor material (1). The stress is reduced and changes in characteristics minimised by adopting a slotted layer structure 1 and 8, in which the element body (1) is part of a wider layer (1 and 8) of the semiconductor material which occupies a majority of the volume around the element body (1) between the substrate (20) and the optical element (10). A slot (9) laterally separates the element body (1) around at least a majority of its periphery from the remainder (8) of the layer.

11 Claims, 4 Drawing Sheets

INFRARED DETECTORS

BACKGROUND OF THE INVENTION

This invention relates to infrared detectors comprising at least one detector element sandwiched between a substrate and an optical element, and relates particularly but not exclusively to such infrared detectors comprising an array of detector elements of cadmium mercury telluride with a corresponding array of immersion lenses as the optical element.

As described in published United Kingdom patent application GB-A-2 132 757 (and the corresponding United States patent specification U.S. Pat. No. 4,629,892), it is known to form an infrared detector comprising a detector element which has a body of infrared-sensitive semiconductor material (for example, cadmium mercury telluride) and which is sandwiched between a substrate and an optical element in the form of a lens, the lens being secured over the element body by an adhesive film. In this manner, optical immersion of the detector element is obtained so as to increase its sensitivity. The whole contents of GB-A-2 132 757 and U.S. Pat. No. 4,629,892 are hereby incorporated herein as reference material.

In the prior art to which GB-A-2 132 757 refers, the adhesive film is present between the detector element and the lens so as to bond the detector element to the lens. However its presence was considered in GB-A-2 132 757 to give rise to difficulties in infrared transmission through the adhesive, in differential thermal expansion leading to structural failure and in adversely affecting a passivated surface of the element body. The invention disclosed in GB-A-2 132 757 provides three small radially-disposed lens contact pads around a single detector element and avoids the provision of the adhesive film between the detector element and the lens. Thus, in accordance with the invention in GB-A-2 132 757, the adhesive film is provided only on the three radially-disposed contact pads which are formed of the same material as the element body.

Immersion lenses and other optical concentrators have also been formed as an array in an optical plate as described in United Kingdom patent specification GB-A-1 525 562, the whole contents of which are hereby incorporated herein as reference material. Similar arrays have also been formed in an optical plate for infrared regions of the spectrum, for example the wavebands 3 to 5 μm (micrometers) and 8 to 14 μm. Pending United Kingdom patent application (GB) 8522539 of Sep. 11, 1985 (published as GB-A-2 241 605 on Sep. 4, 1991) describes an array of infrared detector elements (for example of cadmium mercury telluride) which is bonded to such a lens-array plate by an adhesive film. Such an arrangement is illustrated in FIGS. 1 and 2 of the accompanying drawings.

In the array arrangement previously proposed by the applicant in GB-A-2 241 605 and shown in FIGS. 1 and 2, the adhesive film 11 extends between the element bodies 1 and the lens plate 10 and fills the space between the element bodies 1. The detector elements are infrared photodiodes having a vertical p-n junction 3 dividing the body into a p type region 2 and an n type region 4. The element bodies 1 are mounted (for example by a further adhesive film, not shown in the drawings) on a substrate 20 carrying electrical connections 22 and 24 to respective electrodes 5 and 6 of the regions 2 and 4.

Upon bonding the lens plate 10 to the element bodies 1, the applicant has noticed two unexpected changes in the characteristics of the photodiodes, namely a decline in the cut-off wavelength (for example by almost 1 μm at a wavelength of about 9 μm) and an increase in the junction resistance (for example by about 30% for the vertical junction diodes illustrated). FIG. 3 is a graph illustrating the shift in the cut-off wavelength $\lambda$ in μm. The reciprocal of $\lambda$ is plotted as the ordinate against the operating temperature T of the detector element in degrees Kelvin as the abscissa. The line A is for the detector element material without the lens plate 10 bonded thereto, whereas line B is for the bonded element structure of FIGS. 1 and 2 with a silicon lens array 10 and an epoxy adhesive film 11.

The applicant has found that this shift in cut-off wavelength (and the change in junction resistance) can be significantly reduced by adopting a detector structure in accordance with the present invention.

SUMMARY OF THE INVENTION

According to the present invention there is provided an infrared detector comprising at least one detector element which has a body of infrared-sensitive semiconductor material and which is sandwiched between two members, namely a substrate and an optical element, one of the members being secured over the body by an adhesive film, which device is characterised in that the element body is a part of a wider layer of the infrared-sensitive semiconductor material which occupies a majority of the volume around the element body between the substrate and the optical element, the adhesive film is present between the layer and the one member, and in that the element body is laterally separated around at least a majority of its periphery from the remainder of the layer by a slot which extends through at least part of the thickness of the layer and which defines at least a majority of the periphery of the element body.

Such a device structure can be adopted for an infrared detector comprising a single detector element. However, it is particularly advantageous for arrays of detector elements. The improvement in detector element characteristics (particularly a reduction in the change of cut-off wavelength and resistance) appears to result from a reduction in stress in the semiconductor material, which stress in the FIGS. 1 and 2 structure is induced by the contraction of the adhesive film 11 and changes the energy bandgap of the semiconductor material.

Thus, the applicant explored several possible explanations for the wavelength shift of FIG. 3, namely:

(a) optical interference effects in the interfacial layers between the lens 10 and cadmium mercury telluride material of the body 1. This explanation was discounted because the applicant found that detector elements having different thicknesses of interfacial layers (for example different thicknesses of a ZnS passivation layer) exhibited the same wavelength shift.

(b) absorption in the lens 10 (for example due to oxygen which has a characteristic absorption at 9 μm in silicon). This explanation was discounted because at a temperature of 77 K. the response goes out to 9.9 μm with no fall at 9 μm.

(c) absorption in the silicon lens 10 due to milling damage when forming the lens profile by ion milling the silicon. An experiment was carried out to investigate whether milling changed the infrared transmission of silicon. It did not, and so this explanation was discounted.

(d) absorption in the adhesive film 11. The infrared transmission spectra for the epoxy resin was examined and shows peaks and troughs. However, these peaks and troughs are too closely spaced to account for the loss of response over 1μ in wavelength, and so this explanation was discounted.

(e) a stress-induced change in the energy bandgap of the cadmium mercury telluride due to the differential thermal expansion of the silicon lens material and the cadmium mercury telluride detector element material during cooldown of the detector. Differential thermal expansion was mentioned in GB-A-2 132 757 as a possible problem which could lead to structural failure or degradation of the passivation layer.

(f) a stress-induced change in the energy bandgap of the cadmium mercury telluride due to shrinkage of the adhesive film 11 (for example by evaporation of its solvent on setting of the film 11) which could lead to changes in the dimensions of the element body 1, for example by compression in the vertical direction between the lens 10 and substrate 20 and perhaps even by pulling in the horizontal directions.

Since a change in bandgap would also account for the increase in junction resistance, explanations (e) and (f) were favoured.

In order to investigate the possible explanation (e) above, an array of detector elements formed around apertures in a common layer as described in United States patent specifications U.S. Pat. No. 4,521,798 and U.S. Pat. No. 4,559,695 (our reference PHB32767) was substituted for the array of separate element bodies of FIGS. 1 and 2. The whole contents of U.S. Pat. No. 4,521,798 and U.S. Pat. No. 4,559,695 are hereby incorporated herein as reference material. In this modified form, there is no space between neighbouring detector elements and so the adhesive film 11 is confined to the upper surface of the array layer (and the small apertures in the layer). In this case, substantially no shift in the cut-off wavelength λ was found, and so this possible explanation (e) was also discounted.

Confirmation of the validity of explanation (f) for the wavelength shift is given by the significant reduction in the change of both the cut-off wavelength and resistance when the detector structure in accordance with the invention is adopted. The volume of the adhesive film is significantly reduced in this case since the majority of the volume around the element body is occupied by the wider layer of the semiconductor material (somewhat similar to the modified structure with the array of U.S. Pat. No. 4,521,798 and U.S. Pat. No. 4,559,695), but the definition of the element body of the/each detector element is still retained due to the inclusion of the slot(s) through at least part of the thickness of the layer. It should be noted that the applicant finds that the slot-defined detector elements of the present invention had a much better performance than the modified structure with the array of U.S. Pat. No. 4,521,798 and U.S. Pat. No. 4,559,695 in a detector with bonded immersion lenses and operated at moderately high cryogenic temperature (for example about 192 K.). This better performance seems to be due to the fact that the slots provided around at least a majority of the periphery of each detector element body in accordance with the present invention restrict the volume of the body material contributing to thermally-generated leakage currents, so reducing these leakage currents.

The applicant finds that the adhesive film may be present both in the slot and on the/each detector element body without seriously degrading the detector element characteristics. In this case, the adhesive film on top of the/each detector element body should be kept very thin. However, it is also possible to keep the detector element body/bodies free of the adhesive film, by confining the adhesive to the perimeter of the layer outside of the detector element(s) area.

When an array of said element bodies is present between the substrate and the optical element, there may be present between neighbouring detector elements of the array a part of the layer which does not comprise infrared detector elements of the array and which forms a grid laterally separated by the slots from each of the element bodies. This grid structure may be adopted for linear arrays and for 2-dimensional arrays. However, if desired the grid part may be made discontinuous with further slots being present between parts of the grid in different areas of the array. These further slots may, for example, isolate islands of the layer which are used as parts of the connections to the detector elements. Depending on the arrangement and structure of the array and of its individual detector elements, the slots may extend through the entire thickness of the layer of alternatively through only a part of the thickness of the layer. More than one said layer comprising detector elements and slots may be present, with one layer on top of another, between the substrate and the optical element so that different detector elements having different infrared wavelength response may be formed at the different levels.

The optical element may be, for example, a lens plate on which the detector elements are optically immersed. However the invention may be used in a large variety of applications, some of which may require other optical elements, for example, prismatic elements, wedges, or fibre optic plates. The substrate may be, for example, an insulating support carrying conductive tracks as connections for the detector elements, or a semiconductor integrated circuit, or another layer comprising detector elements of different wavelength response, or for example, simply a base on which an assembly of the detector element(s) and optical element(s) is mounted.

BRIEF DESCRIPTION OF THE DRAWING

These and other features in accordance with the invention are illustrated specifically in embodiments of the invention now to be described, by way of example, with reference to FIGS. 4 to 8 of the accompanying diagrammatic drawings. In these drawings.

Figure 4:
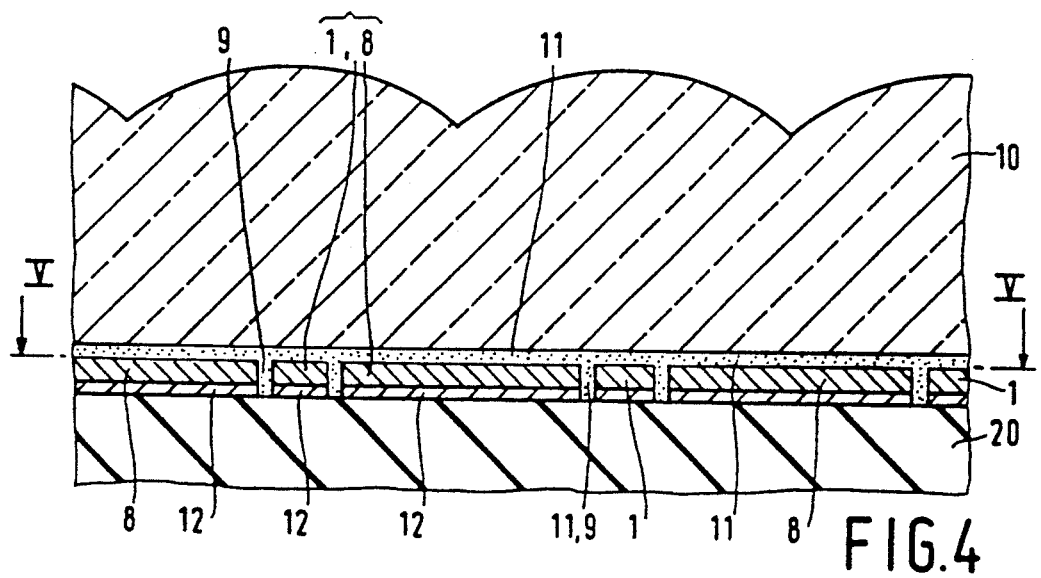
FIG. 4 is a cross-sectional view of part of an infrared detector in accordance with the present invention.
Figure 5:
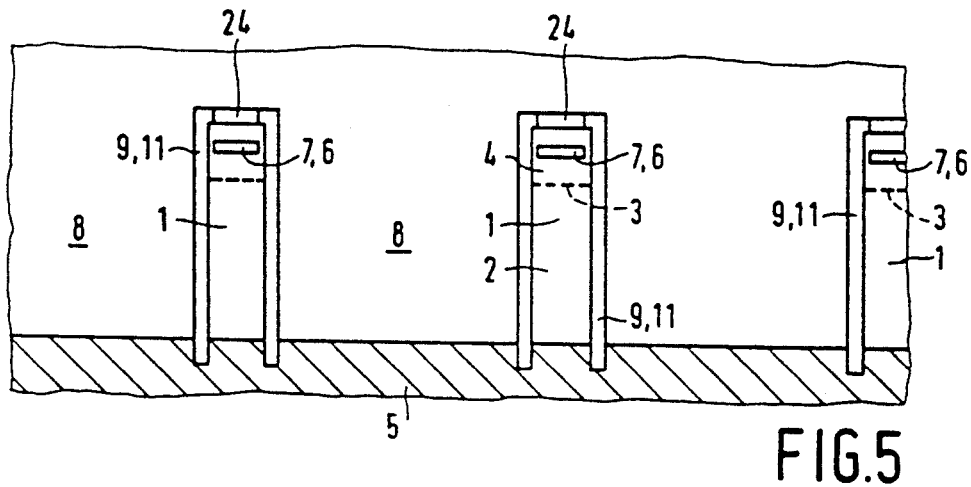
FIG. 5 is a plan view of one example of the detector-element and slotted-layer structure of FIG. 4 for a linear array, and taken on the line V—V of FIG. 4.
Figure 7:
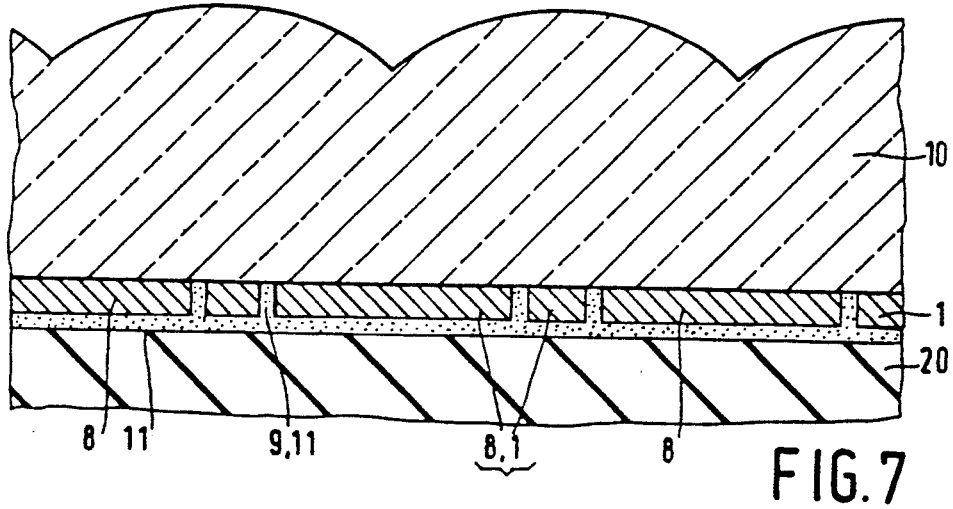
Figure 6:
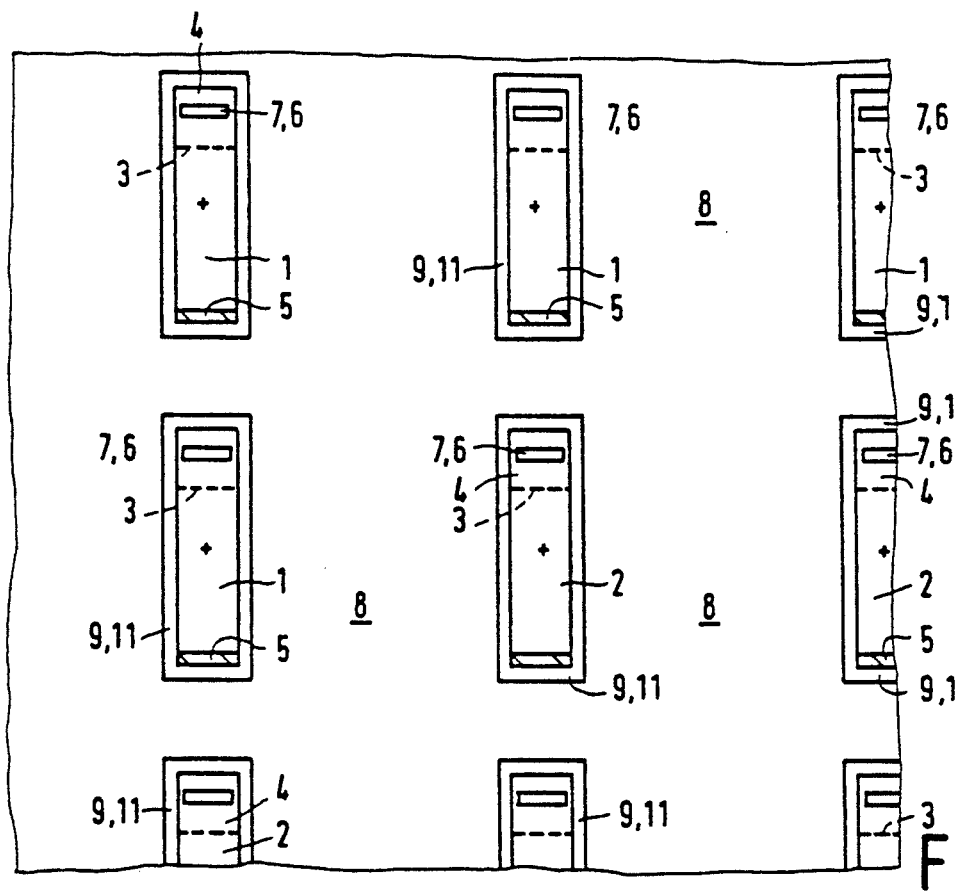
FIG. 6 is a plan view of one example of the detector-element and slotted-layer structure of FIG. 4 for a 2- dimensional array, and taken on the line V—V of FIG. 4.
Figure 8:
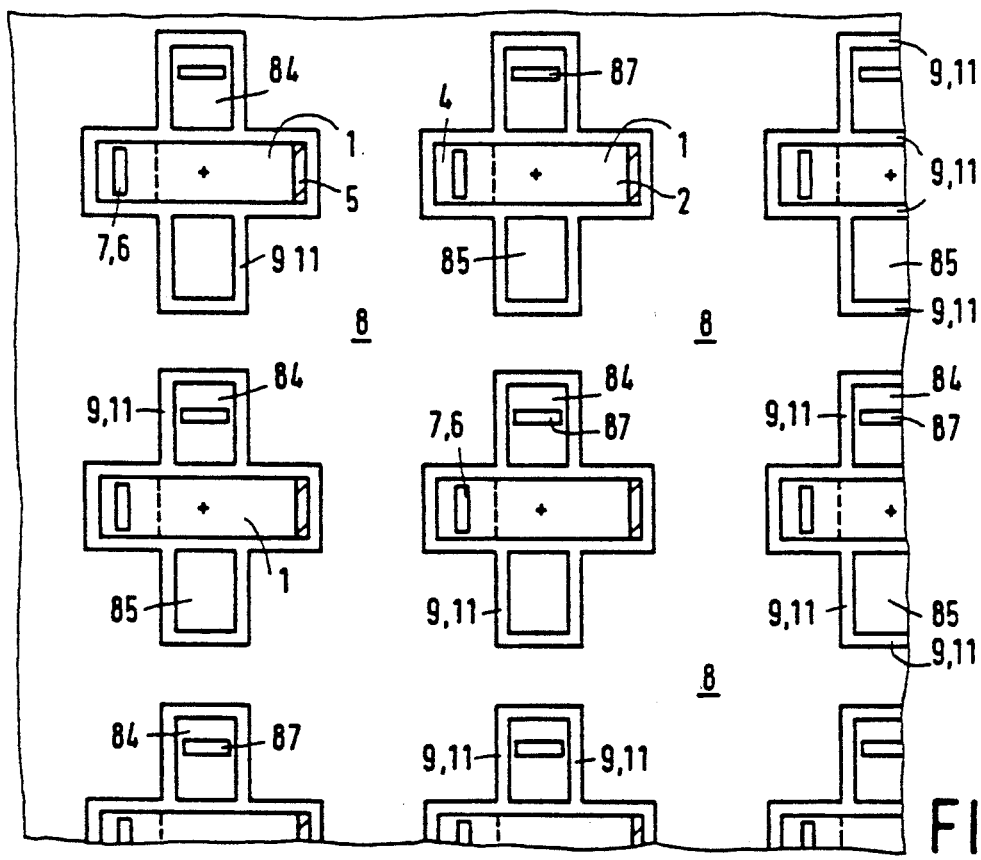
Figure 9:
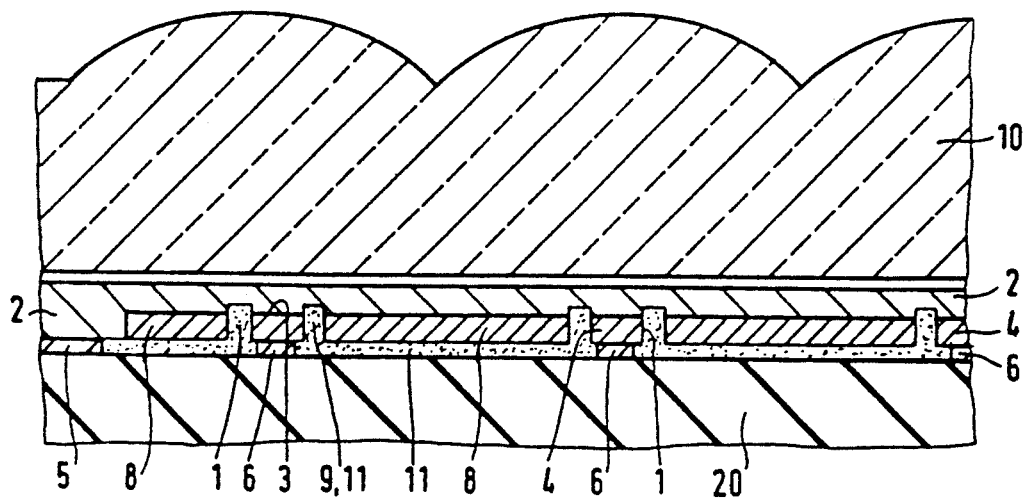
Figure 10:
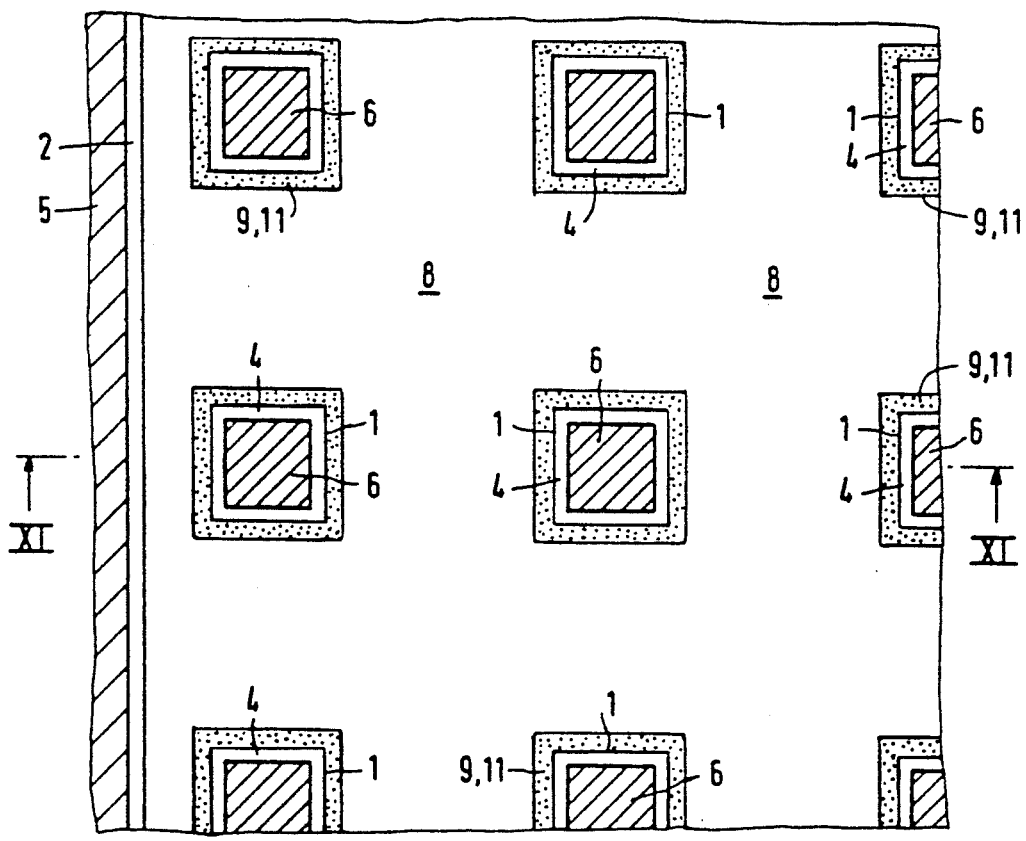

FIG. 7 is a cross-sectional view similar to FIG. 4 of part of the detector of FIG. 5 in a modified form also in accordance with the present invention;

FIG. 8 is a plan view (similar to FIG. 6) of one example of a lower-level layer of detector elements and slots on which the structure of FIG. 6 may be provided to form a 2-level 2-dimensional array of detector elements with different wavelength response, between the substrate and optical element;

FIG. 9 is a cross-sectional view on the line XI—XI of FIG. 10 of part of another example of an infrared detector array in accordance with the present invention and having a modified form for its detector elements, and FIG. 10 is a plan view of the detector-element and slotted-layer structure of FIG. 9.

It should be noted that FIGS. 1 and 2 and FIGS. 4 to 10 are diagrammatic and not drawn to scale. Relative dimensions and proportions of part of these Figures have been shown exaggerated or reduced in size for the sake of clarity and convenience in the drawings. The same reference signs are generally used to refer to corresponding or similar features in the different embodiments and different drawings.

DETAIL DESCRIPTION OF THE PREFERRED EMBODIMENTS

The infrared detector of FIGS. 4 and 5 comprises an array of detector elements sandwiched between a substrate 20 and a lens plate 10. Each detector element comprises a body 1 of infrared-sensitive semiconductor material having an energy bandgap suitable for detecting infrared radiation up to a specified cut-off wavelength at the operating temperature of the detector. In operation, the detector elements are normally cooled by thermal conduction through the substrate 20 to a cryogenic cooler. Thus, for example, the body 1 may be of cadmium mercury telluride whose composition is such that it has a cut-off wavelength of, for example about 12 $\mu$m at about 77 K. and about 9 $\mu$m at about 192 K. As is known, a temperature of about 77 K. can be obtained with a liquid-nitrogen cryostat (for example a Joule-Thomson cooler, or Stirling engine), whereas a temperature of 192 K. can be obtained thermoelectrically using a Peltier cooler.

In accordance with the present invention, each element body 1 is a part of a wider layer 1 and 8 of the infrared-sensitive material which occupies a majority of the volume around the body 1 between the substrate 20 and the lens plate 10. There is present between the layer 1 and 8 and the lens plate 10 an adhesive film 11 by means of which the lens plate 10 is secured over the element bodies 1. Each element body 1 is laterally separated around at least a majority of its periphery from the remainder 8 of the layer 1 and 8 by a slot 9. The slot 9 extends through the thickness of the layer 1 and 8 (see FIG. 4) and defines at least a majority of the periphery of the element body 1 (see FIGS. 5 and 6). In the example of FIG. 5, the slot 9 extends on three of the four sides of the element body 1 as a U shaped outline around most of the body periphery. In the example of FIG. 6, the slot 9 extends on all sides of the element body 1 as a rectangular outline.

In specific examples of the detector of FIGS. 4 and 5 or FIGS. 4 and 6, each element body 1 comprises a vertical p-n junction 3 between an n type region 4 at one end of the body 1 and a p type region 2 at the opposite end of the body 1. The layer 1 and 8 may be of p type conductivity in which the n type regions may be formed by ion-milling apertures 7 through the thickness of the p type layer by the method disclosed in U.S. Pat. No. 4,559,695. Each aperture 7 may then be lined with an electrode 6. A thin metal layer (for example of chromium) deposited to form the electrode 6 may also provide the electrode 5 for the p type region 2. The structure of the detector elements in this example is such that the slots 9 extend through the entire thickness of the layer 1 and 8. The slot 9 may be etched through the layer 1 and 8 using a chemical etchant which does not convert the conductivity type, for example a known etchant solution of bromine in methanol. Preferably, at least the top and bottom faces of the detector element are passivated, for example with a layer of zinc sulphide. This passivation layer may also extend on the top and bottom faces of the remainder 8 of the layer 1 and 8.

Figure 1:
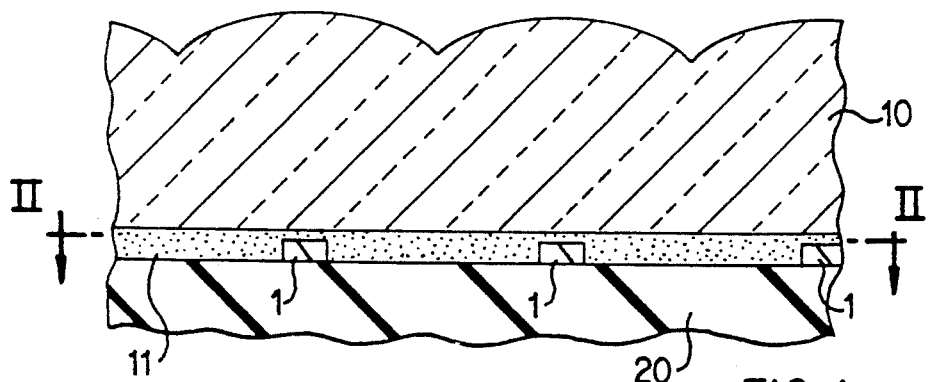
FIG. 1 is a cross-sectional view of an infrared detector of the type described in GB-A-2 241 605.
Figure 2:
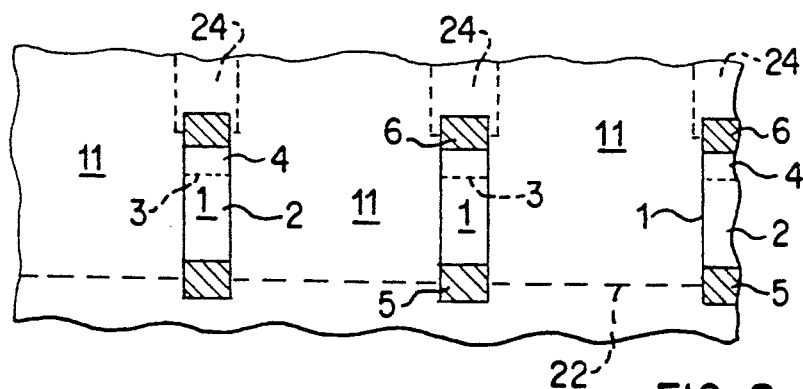
FIG. 2 is a plan view of the detector-element and adhesive-film structure of the detector of FIG. 1, and taken on the line II—II of FIG. 1.
Figure 3:
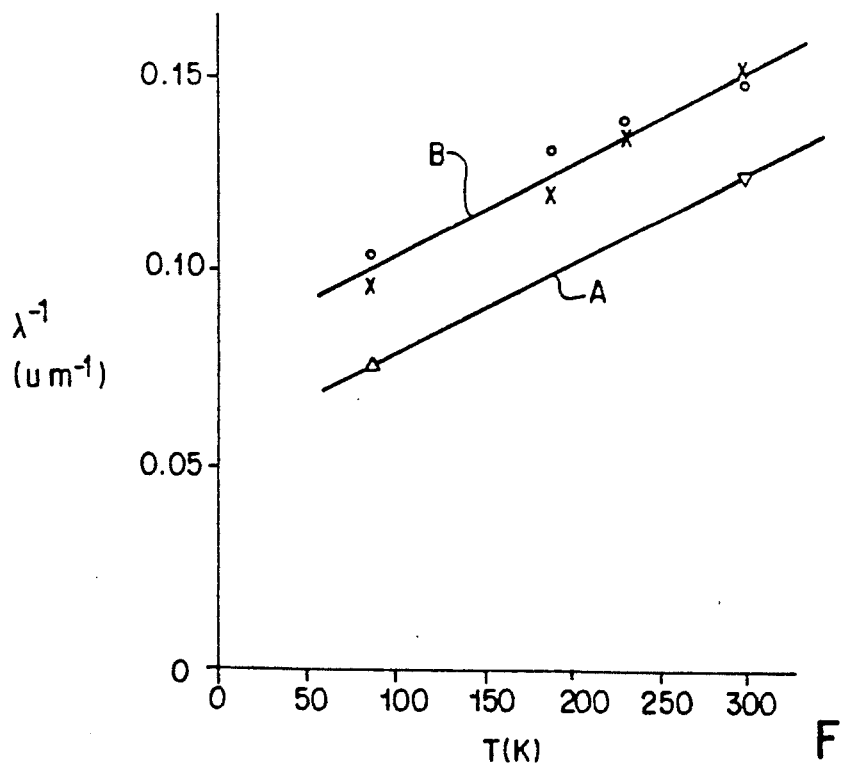
FIG. 3 is a graph of the reciprocal of the cut-off wavelength λ in μm against the operating temperature T in K., showing the wavelength shift on bonding to the lens plate in the structure of FIGS. 1 and 2.

In this specific example of the detector of FIGS. 4 and 5, the substrate 20 may be of, for example, sapphire or another insulating material carrying a metallisation pattern forming conductor tracks as electrical connections for the detector elements (similar to tracks 22 and 24 shown in FIGS. 1 and 2). The layer 1 and 8 is bonded to the substrate 20 by an adhesive film 12, and is processed to form the regions 4, apertures 7, electrodes 5 and 6 and slots 9 in situ on the substrate 20. The electrode 6 of each detector element extends in the aperture 7 through the thickness of the body 1 to an underlying part of the substrate connection 24 (which is only shown in FIG. 5 where it crosses the slot 9).

In the embodiment of FIG. 4, the adhesive film 11 (which may be an insulating epoxy, in a specific example) is present both in the slots 9 and on each element body 1 facing the lens plate 10 so as to bond each detector element to the plate 10. The adhesive film between the element body 1 and the lens plate 10 is very thin so that the detector elements are optically immersed on the lens. Even in this case with the adhesive 11 in the slots 9, the volume of the adhesive 11 contacting the bodies 1 is greatly reduced in the FIG. 4 structure in accordance with the invention, as compared with the FIG. 1 structure. This significantly reduces straining of the semiconductor lattice of the cadmium mercury telluride body 1 and its consequent change in the energy bandgap.

Table 1 illustrates this improvement, in terms of the cut-off wavelength $\lambda$ in $\mu$m measured at two temperatures (77 K. and 192 K.) both before and after bonding the lens plate 10 to the detector-element bodies 1 by the adhesive film 11.

TABLE 1

| | NM = not measured | | | |
| --- | --- | --- | --- | --- |
| | $\lambda$ (77K) in $\mu$m | | $\lambda$ (192K) in $\mu$m | |
| DES | before | after | before | after |
| 2a | NM | NM | 8.8 | 7.9 |
| 2b | NM | NM | 8.9 | 8.1 |
| 2c | NM | 9.9 | 8.9 | 8.0 |
| 2d | NM | 9.6 | 9.0 | 7.9 |
| 3a | NM | 11.5 | NM | 9.0 |
| 3b | NM | 12.0 | NM | 8.9 |
| 3c | NM | 11.8 | NM | 8.9 |
| 5a | 11.7 | 11.7 | 9.1 | 8.9 |
| 5b | NM | 12.2 | NM | 9.0 |

The results of Table 1 were measured for three different detector element structures (DES) formed from the same slice of cadmium mercury telluride, each mounted on its own sapphire substrate 20 below a lens plate 10. Detector element structures 5a and 5b were those of the specific example of FIGS. 4 and 5, in which the thickness of the cadmium mercury telluride layer 1 and 8 was about 2.5 μm, the element bodies 1 were 10 μm wide and 15 μm long, the slots 9 were about 5 μm wide, the width of the layer part 8 between neighbouring element bodies 1 was about 35 μm, and the epoxy adhesive film was 100 to 200 nm thick on the element bodies 1 and filled the slots 9. Detector element structures 2a to 2d were for a comparable specific example of FIGS. 1 and 2 having the same element body size as for DES 5a and 5b but with the layer part 8 etched away and filled with the epoxy adhesive 11. Detector element structures 3a to 3c were for another comparable specific example in which the detector elements 1 of FIGS. 1 and 2 and of FIGS. 4 and 5 were replaced with a p type layer of the same thickness as the layer 1 and 8 but having detector elements formed around apertures in the layer as in U.S. Pat. No. 559 695 and without any slots 9 in the layer. The spread in values for the same detector-element structures measured under the same conditions result from the measurement accuracy and slight variations in the thickness of the cadmium mercury telluride and the epoxy adhesive.

As can be seen from the "before" and "after" measurements in Table 1, there is little change in the cut-off wavelength for the DESs 5a and 5b in accordance with the invention. Furthermore, the "after" measurements of these DESs 5a and 5b are comparable with those for the virtually continuous layer of DESs 3a to 3c. By contrast the measurements of the DESs 2a to 2d show a decrease in λ of about 1 μm after bonding to the lens plate 10, at both operating temperatures 77 K. and 192 K. Although DESs 3a to 3c had comparable λ characteristics to DESs 5a and 5b in accordance with the invention, the detectivity (D*) of DESs 3a to 3c was only 0.7 cm.Hz$^{\frac{1}{2}}$.W$^{-1}$ at 192 K. and this was only a third of the detectivity of DESs 5a and 5b at that temperature. This poorer performance of DESs 3a to 3c seems to result from the large volume of p type material around their element junctions which contributes to the thermally-generated leakage currents in DESs 3a to 3c. By contrast therewith, DESs 5a and 5b in accordance with the invention had a higher junction resistance which seems to result from the slots 9 extending on three of the four sides of the element body so restricting the volume of p type material which contributes to the thermally-generated leakage current of the detector element.

The following Table 2 lists similar λ measurements made on further detector element structures in accordance with the specific example of FIGS. 4 and 5 and with substantially the same dimensions, but constructed from different slices of cadmium mercury telluride of about the same composition.

TABLE 2

| DES | λ (77K) in μm | | λ(192K) in μm | |
|-----|--------|-------|--------|-------|
|     | before | after | before | after |
| 5c  | 12.5   | 12.8  | NM     | 9.4   |
| 5d  | 12.4   | 13.2  | NM     | 9.1   |
| 5e  | NM     | 11.9  | NM     | 9.0   |

It is possible to confine the adhesive to the perimeter of the layer 1 and 8 so that the central area comprising the detector elements is kept free of the adhesive film 11. Thus, in the linear array of FIG. 5, the adhesive 11 may be provided in a rectangular frame around the layer 1 and 8 or for example only along the top and bottom of the FIG. 5 drawing. It is desirable to press the lens plate 10 tightly against the layer 1 and 8 during the adhesive bonding in order to minimise the air gap between the detector elements 1 and the lens plate 10 so as to preserve good optical immersion. However, rather than trying to limit the location of the adhesive film 11 on the layer 1 and 8, it is often more convenient in a manufacturing process to provide a thin film of the adhesive 11 over the whole upper face of the detector element array. In this case, the adhesive also flows into the slots 9 and tends to fill these slots, although they may remain partly unfilled due to trapped pockets of air. In order to reduce the volume of adhesive 11 bonding the element bodies (and so reduce stress in the element bodies 1), the width of the slots 9 is preferably kept to a minimum consistent with a reliable manufacturing yield. The minimum reliably reproduceable width for the slots 9 depends on the etching process used for their formation. However, typically, the width of the slots 9 may be between two and three times the thickness of the layer 1 and 8, and preferably is less than five times the thickness of the layer 1 and 8.

The detector elements shown in FIG. 5 are arranged in a row as a linear array. The remainder 8 of the layer 1 does not comprise infrared detector elements of the array but merely forms a grid (in the shape of a ladder) which occupies a majority of the volume around the detector-element bodies 1 so as to reduce their straining by the adhesive film 11. In the particular form shown in FIG. 5, the row of bodies 1 extend laterally as finers of a comb from an integral part of the remainder 8 of the layer 1 and 8. This integral part underlies an extension of the electrode 5 which forms a common electrical connection to the row of element bodies 1. The common extended electrode 5 may electrically contact most (or even the whole) of the p type underlying integral part which may therefore form an electrical part of the common electrical connection of the array. However, except where it contacts the region 2 in each element body 1, the extended electrode 5 may be insulated by a passivation layer of ZnS from the p type underlying integral part which may therfore simply constitute a mechanical support for part of the common electrical connection 5. The common extended electrode 5 may extend over the edge of the layer part 8 and onto the substrate conductor 22 (not shown in FIG. 5).

However a modification of FIG. 5 is possible in which the slots 9 extend also on the fourth side of each rectangular body 1 so as to isolate the element bodies 1 from the remainder 8 of the layer 1 and 8. In this case, the electrode 5 of each detector element may be confined to an end face of the p type region 2 of each element body 1 and extend directly from that end face to a conductor track 22 on the substrate 20. The body structure of each detector element may even be similar to that of the element bodies 1 of FIG. 2, except that the remainder 8 of the layer 1 and 8 which provides the element bodies 1 extends as a grid between and around the element bodies 1 from which it is separated by the slots 9.

FIG. 5 illustrates a single row of the element bodies 1 arranged in a linear array. The structure of FIG. 5 can be adapted to form two such rows of element bodies 1 by providing a mirror image of the FIG. 5 structure at the top half of FIG. 5. In this double-row device, the element bodies 1 of one row may be located in line with corresponding element bodies 1 of the other row. Alternatively, the element bodies 1 of one row may be located in line with layer parts 8 between neighboring element bodies 1 of the other row.

The present invention may also be used for 2-dimensional arrays of detector elements. One example of such a 2-dimensional array in accordance with the invention is illustrated in FIG. 6, in which the element bodies 1 are isolated parts of the layer 1 and 8, the remainder 8 of which does not comprise any infrared detector elements and forms a rectangular grid network around the element bodies 1 from which it is separated by the slots 9. The electrodes 5 to the p type region 2 of each detector element may extend on an end face of the element body 1. The electrodes 6 to the n type regions 4 may extend on an opposite end face of each body 1 or in a aperture 7 in each element body 1. It is also possible to use the grid 8 to support (or even form an electrical part of) a common connection to the p type regions 2 of the detector elements by having the slot 9 on three sides only (i.e. not at the p type end) of each element body 1. In the FIG. 6 embodiment an insulating substrate 20 with conductor tracks 24 and 25 may be used (similar to the previous embodiments). Alternatively, the substrate 20 may be, for example, a silicon integrated circuit comprising both connections for the detector elements and circuitry for processing the signals from the detector elements.

In the embodiments so far described, the lens plate 10 is bonded by the adhesive film 11 to the layer 1 and 8 which is already mounted on the substrate 20. FIG. 7 illustrates another embodiment in which the layer 1 and 8 is first provided on the lens plate 10, and the substrate 20 is then bonded by the adhesive film 11 to the layer 1 and 8 on the lens plate 10. In this case, the layer 1 and 8 may be of crystalline material (for example cadmium mercury telluride) epitaxially grown on the lens plate 10 which may be of for example monocrystalline cadmium telluride or for example monocrystalline silicon coated with cadmium telluride at the face where the cadmium mercury telluride layer 1 and 8 is to be deposited. After growing the cadmium mercury telluride as a continuous layer on the lens plate 10, it is then processed to form the regions 4, apertures 7, electrodes 5 and 6 and slots 9 in situ on the lens plate 20. In this case, the detector elements may be connected to circuitry formed in parts of the silicon lens plate adjacent to the part 8 of the cadmium mercury telluride layer 1 and 8.

The embodiments illustrated herein have been described with a layer 1 and 8 of cadmium mercury telluride, because this is the most common and most important infrared-sensitive semiconductor material for high performance detectors. However, the invention may also be used with other infrared-sensitive semiconductor materials, for example indium antimonide.

Although an array of lenses corresponding to the array of detector elements has been illustrated in a lens plate 10, the invention may also be used with other optical elements. Thus, the element bodies 1 and the remainder 8 of the layer 1 and 8 (with the slots 9) may be sandwiched between a substrate 20 and an optical plate 10 comprising an array of prismatic elements corresponding to the array of detector-elements (for example as in GB-A-1 525 562), or even a wedge-shaped plate or single lens element over the whole of an array (for example as in FIGS. 2, 5, 8 and 9 of United Kingdom patent application 8531497.9 published as GB-A-2 240 444 on Jul. 31, 1991). The whole contents of GB-A-2 240 444 (our reference PHB33234) are hereby incorporated herein as reference material.

Furthermore, although the embodiments described so far show only a single level of detector elements between the substrate 20 and the optical element 10, the invention may be applied to each level of a multiple-level detector array structure (for example as described in pending United Kingdom patent application 9022464.3, our reference PHB33674, filed on Oct. 17, 1990 and published as GB-A-2 248 964 on Apr. 22, 1992). The whole contents of GB-A-2 248 964 are hereby incorporated herein as reference material. The two levels may comprise different infrared-sensitive semiconductor materials having different bandgaps so as to provide different infrared wavelength responses. The lower level may be mounted on, for example, a silicon integrated circuit 20 via an epoxy adhesive layer. As an example in accordance with the invention, the upper level of detector elements may have the layer structure 1 and 8 illustrated in FIG. 6, whereas the lower level may have the layer structure 1 and 8 illustrated in FIG. 8. In this lower level of FIG. 8, the slots 9 not only separate the lower element bodies 1 from the remainder of the layer 8 but also isolate both n type islands 84 and p type islands 85 from the p type remainder 8 of the layer and from the lower element bodies 1. When the upper level layer structure 1 and 8 is aligned on this lower level structure, the element bodies 1 are superimposed as a cross centred on the symbol '+' in FIGS. 6 and 7 and the n type region 4 of the upper detector elements overlies a lower n type island 84. The aperture 7 through the upper region 4 is continued through the underlying island 84 as an aperture 87 to carry the upper-level electrode 6 to the circuit substrate 20. The upper-level electrode 5 may be carried to the circuit substrate 20 via the p type islands 85. The upper layer 1 and 8 of FIG. 6 is bonded to the lower layer 1 and 8 of FIG. 8 by an adhesive film, and an optical element 10 is bonded to the upper layer 1 and 8 of FIG. 6 by the film 11 as previously described.

Even in a device embodiment having a single level of detector elements 1 in a single slotted layer 1 and 8 between the substrate 20 and the optical element 10, the slots 9 in the layer 1 and 8 may isolate islands 84 and 85 from the element bodies 1 and the remainder 8 of the layer 1 and 8. In this case, instead of the detector elements 1 of the layer 1 and 8 having electrodes 5 and 6 extending either down a side of the element body 1 or through an aperture 7 in the element body 1, the detector element connections may comprise the islands 84 and 85 which are electrically connected to the element body 1 by bridging conductor tracks extending over an insulating filling in the slots 9.

The detector elements in the embodiments of FIGS. 4 to 8 comprise a vertical p-n junction 3, and the slots 9 extend through the entire thickness of the layer 1 and 8 to define the periphery of each element body 1. The embodiment of FIGS. 9 and 10 illustrates a modified detector-element structure having a horizontal p-n junction 3 between an n type region 4 and an underlying p type region 2. The total semiconductor layer 1 and 8 in this example comprises a p type sub-layer 2 adjacent one face and n type regions adjacent its opposite face. The slots 9 are present in this opposite face and extend through only a part of the thickness of the layer 1 and 8 to the n type sub-layer 2. In a specific example, the total thickness of the layer 1 and 8 may be 10 μm whereas the slots 9 may have a depth of 6 μm.

The p type sub-layer 2 provides a common electrical connection of the array of detector elements, and it may extend to the opposite face (for example at a peripheral region of the layer 1 and 8) where an electrode 5 may be provided. The n type regions adjacent this opposite face may be restricted to the areas of the element bodies 1, or they may be present also in the remainder 8 of the layer in which case (as shown in FIGS. 9 and 10) they are isolated from the element regions 4 by the slots 9. The element bodies 1 have individual electrodes 6 contacting their regions 4. FIG. 10 illustrates this embodiment as a modification of the FIG. 7 arrangement in which the layer 1 and 8 is of cadmium mercury telluride epitaxially grown on a cadmium telluride buffer layer on the lens plate 10.

In the embodiments of FIGS. 4 to 10, one or more slotted infrared-sensitive semiconductor layers 1 and 8 occupies most of the thickness between the substrate 20 and optical element 10. However, the detector elements may comprise a slotted layer 1 and 8 of such infrared-sensitive semiconductor material (for example cadmium mercury telluride) on a thick insulating layer (for example cadmium telluride), and this thick insulating layer may even occupy as much as half of the thickness between the substrate 20 and the optical element 10.

From reading the present disclosure, other variations and modifications will be apparent to persons skilled in the art. Such variations and modifications may involve equivalents and other features which are already known in the design, manufacture and use of infrared detectors and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An infrared detector comprising at least one detector element which has a body of infrared-sensitive semiconductor material and which is sandwiched between two members, namely a substrate and an optical element, one of the members being secured over the body by an adhesive film, characterised in that the element body is a part of a wider layer of the infrared-sensitive semiconductor material which occupies a majority of the volume around the element body between the substrate and the optical element, the adhesive film is present between the layer and the one member, and in that the element body is laterally separated around at least a majority of its periphery from the remainder of the layer by a slot which extends through at least part of the thickness of the layer and which defines at least a majority of the periphery of the element body.

2. A detector as claimed in claim 1, further characterised in that an array of said element bodies is present between the substrate and the optical element, and in that there is present between neighbouring detector elements of the array a part of the layer which does not comprise infrared detector elements of the array and which forms a grid laterally separated by the slots from each of the element bodies.

3. A detector as claimed in claim 2, further characterised in that a row of said element bodies extend laterally as fingers of a comb from a part of the layer forming part of a common electrical connection to the row of element bodies.

4. A detector as claimed in claim 2, further characterised in that the slots extend through only a part of the thickness of the layer to a sub-layer of one conductivity type which provides a common electrical connection of the array of detector elements.

5. A detector as claimed in claim 1, further characterised in that the adhesive film is present both in the slot and on the/each detector element body facing the one member so as to bond the/each detector element to the one member.

6. A detector as claimed in claim 1, further characterised in that at least one electrical connection for the/each detector element is carried by the substrate.

7. A detector as claimed in claim 6, further characterised in that an electrode of the/each detector element extends in an aperture through the thickness of the/each element body to the substrate connection.

8. A detector as claimed in claim 1, further characterised in that the layer is mounted on the substrate, and the optical element is bonded by the adhesive film to the layer on the substrate.

9. A detector as claimed in claim 1, further characterised in that the layer is of crystalline material epitaxially grown on the optical element, and the substrate is bonded by the adhesive film to the layer on the optical element.

10. A detector as claimed in claim 1, further characterised in that the layer is of cadmium mercury telluride.

11. A detector as claimed in claim 1, further characterised in that two of said slotted layers of infrared-sensitive semiconductor material are present between the substrate and the optical element, one layer being present on top of the other layer and having a different infrared wavelength response.

* * * * *